(12) United States Patent
Kaule

(10) Patent No.: US 7,241,537 B2
(45) Date of Patent: Jul. 10, 2007

(54) METHOD FOR PRODUCING AN EXPOSED SUBSTRATE

(75) Inventor: Wittich Kaule, Emmering (DE)

(73) Assignee: Giesecke & Devrient GmbH, Munich (DE)

( * ) Notice: Subject to any disclaimer, the term of this patent is extended or adjusted under 35 U.S.C. 154(b) by 0 days.

(21) Appl. No.: 10/545,195

(22) PCT Filed: Feb. 24, 2004

(86) PCT No.: PCT/EP2004/001816

§ 371 (c)(1),
(2), (4) Date: Jan. 4, 2006

(87) PCT Pub. No.: WO2004/077493

PCT Pub. Date: Sep. 10, 2004

(65) Prior Publication Data

US 2006/0141385 A1  Jun. 29, 2006

(30) Foreign Application Priority Data

Feb. 26, 2003 (DE) ................ 103 08 328

(51) Int. Cl.
*G03F 7/22* (2006.01)
*G03F 7/20* (2006.01)
*G03F 7/16* (2006.01)
*G03H 1/04* (2006.01)

(52) U.S. Cl. ............... 430/1; 430/10; 430/11; 430/15; 430/22; 430/273.1; 430/290; 430/296; 430/327; 430/328

(58) Field of Classification Search .......... 430/10, 430/11, 15, 22, 273.1, 327, 328, 290, 1, 296
See application file for complete search history.

(56) References Cited

U.S. PATENT DOCUMENTS

| 4,255,514 | A | | 3/1981 | Kane ............... 430/320 |
| 4,282,308 | A | | 8/1981 | Cohen et al. ........ 430/271 |
| 5,252,414 | A | * | 10/1993 | Yamashita et al. ...... 430/22 |
| 5,733,708 | A | * | 3/1998 | Catanzaro et al. ..... 430/296 |
| 5,944,974 | A | * | 8/1999 | Fahrenberg et al. ..... 205/70 |
| 6,337,163 | B1 | | 1/2002 | Sato ................ 430/30 |
| 6,905,802 | B2 | * | 6/2005 | Lin .................. 430/5 |

FOREIGN PATENT DOCUMENTS

| DE | 3837874 A1 | 5/1990 |
| DE | 19524099 A1 | 1/1997 |
| EP | 1225477 A1 | 7/2002 |
| EP | 1321890 A1 | 6/2003 |
| JP | 02187012 | 7/1990 |
| JP | 02262319 | 10/1990 |
| JP | 2001135565 | 5/2001 |
| WO | 01/20402 A1 | 3/2001 |
| WO | PCT/EP2004/001816 | 6/2005 |

OTHER PUBLICATIONS

Utaka K. et al., "lambda!/4-shifted InGaAsP/InP DFB lasers by simultaneous holographic exposure of positie and negative photoresists", XP002312959, Electronics Letters UK, Nov. 22, 1984, vol. 20; pp. 1008-1010.
Krauss P. R. et al., "Nano-campact disks with 400 Gbit/in<2> storage fabricated using nanoimprint lithography and read with proximal probe", XP002330220, Applied Physics Letters AIP USA, Nov. 24, 1997, pp. 3174-3176.
Xiaoyun Sun et al., "Multilayer resist methods for nanoimprint lithography on nonflat surfaces", XP002330221, AIP for American Vacuum Society USA, Nov. 6, 1998, pp. 3922-3924.
Bao L-R et al., "Nanoimprinting over topography and multilayer three-dimensional printing", XP002330222, AIP for American Vacuum Society USA., Nov. 6, 2002, pp. 2881-2885.
Database WPI, Section CH, week 200122, Derwent Publications Ltd., Class A89; XP002312856, Dec. 19, 2000.

* cited by examiner

*Primary Examiner*—Richard L. Schilling
(74) *Attorney, Agent, or Firm*—Bacon & Thomas, PLLC

(57) ABSTRACT

Method for producing an exposed substrate, which has at least two different image areas. The substrate is provided with at least two photoresist layers, which are adjusted to the type of image areas to be produced.

26 Claims, 17 Drawing Sheets

METHOD FOR PRODUCING AN EXPOSED SUBSTRATE

BACKGROUND

The invention relates to a method for producing an exposed substrate, which has at least two image areas.

For protecting security documents, such as bank notes, ID cards or the like, optically variable elements are often used, which are made up of diffraction gratings. In the following such elements are referred to as grating images. These may be grating images, in which for the viewing the first and higher diffraction order is made use of, as it is the case with e.g. holograms or with grating images that are composed of grating areas. Alternatively, grating images are used, in which the zero diffraction order is made use of, as described for example in U.S. Pat. Nos. 4,892,385 and 4,484,797.

The first-order grating images and the zero-order grating images mainly differ from each other in that with the first-mentioned the grating constant has to be greater than the light wavelength, while with the last-mentioned the grating constant preferably is selected smaller than the wavelength, in particular when one wants to observe the pure zero order. While for first-order grating images the grating constant is decisive for the color variability and the grating line structure plays an only minor role, with the zero-order grating images it is precisely the other way round.

The diffraction structures used as security elements mostly are produced as embossed holograms. For that purpose a photoresist layer applied to a substrate is exposed with laser light or with electron beams. The term photoresist refers to film-forming materials sensitive to radiation, e.g. photoresins, the solubility behavior of which changes when exposed to light or radiation. One differentiates between positive- and negative-working photoresists. The first-mentioned become easily soluble by photochemical degradation or conversion of active groups when exposed to radiation, while the last-mentioned become hardly soluble or insoluble by crosslinking or photopolymerization.

The development of the photoresist layer leads to a peak-and-valley structure, which can be galvanically molded. In first-order grating images the profile structure preferably has a sinusoidal form, in zero-order grating images it has a box-type or trapezoidal form. The molded structure can be duplicated and used for producing embossing dies.

Furthermore, grating images are known for which a plurality of exposure steps have to be combined with each other. For this purpose mainly two methods are known.

In a first method partial areas of a photoresist layer are covered with the help of masks and then the unmasked partial areas of the photoresist layer are exposed with e.g. laser light of a first wavelength as to produce a diffraction structure. In further procedure steps the already exposed parts of the photoresist layer are covered and the parts of the image now freed of the masks are exposed with e.g. laser light of different wave lengths as to produce further diffraction structures.

This method has the disadvantage that it cannot be used, if in a grating image different resist layer thicknesses are required, as it is the case e.g. when zero-order grating images are combined.

In a further known method this problem is avoided by galvanically producing a plurality of embossing dies out of independently exposed photoresist layers. Each embossing die contains only a partial area of the complete image. In order to obtain the complete image the embossing dies are embossed side-by-side into thermoplastic material. With this method, however, it is disturbing that such a side-by-side embossing leads to the forming of seams.

Starting out from this prior art it is the problem of the invention to provide a method, wherein the exposure with different types of radiation can be effected in a simple fashion and wherein, optionally, the layer thickness in different areas can be adjusted to the exposure.

SUMMARY

According to the inventive method for producing a resist master, which has at least two different image areas, at least two photoresist layers are used that are adjusted to the type of image areas to be produced. This has the advantage that every image area can be produced under optimal circumstances and thus shows the optimal optical effect.

The term "photoresist" within the terms of the invention refers to a radiation-sensitive material, the chemical properties of which, in particular its solubility behavior, changes under the action of luminous radiation or particle radiation.

"Positive resist" refers to photoresist materials that become easily soluble by photochemical degradation or conversion of active groups. I.e., the exposed areas are dissolved away in the subsequent treatment, whereas the unexposed areas are left.

"Negative resist" refers to photoresist materials that become hardly soluble or insoluble by crosslinking or photopolymerization. I.e., the unexposed areas are dissolved away in the subsequent treatment, whereas the exposed areas are left.

The term "grating image" is not restricted to grating line images, but comprises any form of diffraction structures. Only when used in contrast to a true hologram, then this term is to be understood in the narrower sense.

A "substrate" means any carrier material adapted to be coated with photoresist layers for the purpose of exposure. For this purpose frequently glass plates are used, which may be colored black or coated. Already galvanically molded nickel shims already provided with any grating image can be used likewise. Onto this a further photoresist layer is applied and corresponding to the employed photoresist exposed and processed with a second grating image. Furthermore, plastic foils or metal foils that are already provided with a grating image, preferably in the form of an embossing, are suitable as substrates.

The term "resist master" refers to the substrate that is produced according to the invention, which has at least one exposed and developed photoresist layer. In further procedure steps the resist master can be galvanically molded and further processed to form so-called embossing shims.

According to a first embodiment of the invention for producing a resist master, which at least has two different image areas, e.g. a true hologram and a grating image, at least two photoresist layers are used, which are optimally adjusted to the respective type of radiation used. For a holographic exposure usually laser radiation is used, but for producing gratings electron beams are often used. With the help of the invention such different manufacturing variants can be combined with each other on one substrate.

A further selection criterion for the photoresist layers used in the different image areas may be the profile of the relief structure to be produced. Zero-order grating images require flanks as steep as possible, while for first-order grating images flat flank angles are preferred. In particular sinusoidal profiles are the goal. With the help of the inventive method on one substrate zero-order grating images can be combined with any first-order grating images.

The inventive method also offers the possibility that the different image areas are provided with different zero-order grating images. With this type of grating images the color variability solely results from the destructive interference of the radiation reflected by the surfaces of the photoresist. I.e. the essential parameter here is the profile depth of the relief structure, the profile depth only depending on the layer thickness of the photoresist. The thickness can be adjusted very exactly and preferably lies in the range of about 50 to 200 nanometer. Accordingly, the substrate can be provided with at least two photoresist layers, which are made out of the same photoresist material but have different thicknesses.

The photoresist layers according to the invention can be disposed on the carrier material before the first exposure step is carried out. Preferably, they are applied one above the other, optionally with intermediate protection layers.

The topmost layer is optimized for producing a first image area, e.g. with respect to a first type of radiation, and the next layer is optimized for producing a second image area, e.g. with respect to the layer thickness or a different type of radiation etc. Intermediate between the resist layers optionally "stop layers" are located, which ensure that the layers are exposed solely with the right radiation.

In a preferred embodiment a positive resist layer suitable for optical holographic exposure is applied onto a positive resist layer which is suitable for exposure by electron beam and insensitive to the action of optical radiation.

This layer sequence at first is optically exposed in the respective areas, e.g. with a hologram. This exposure only acts upon the topmost layer, and not on the optically insensitive layer therebelow. The other areas all-over are optically exposed and additionally are exposed with a desired electron beam grating image, such as e.g. described in DE 102 26 115 or DE 102 26 112. In these areas the optical exposure leads to an erasure of the topmost layer, while the exposure by electron beam penetrates the topmost layer and produces an image in the lower layer. After the resist development the two image areas lie side-by-side.

According to a further inventive embodiment the individual photoresist layers are applied onto the substrate and exposed with the respective grating image not until a suitable phase of the manufacturing process has been reached.

Onto the substrate at first a first photoresist layer can be applied, exposed and developed. This first photoresist layer with respect to its nature is adjusted to the type of radiation used for the exposure or with respect to its layer thickness is optimized for a certain imaging method. In a further procedure step a second photoresist layer is applied onto the substrate and the first photoresist layer left thereon, and again is exposed and developed. Since the second photoresist layer can be selected independently of the first photoresist layer, for the second photoresist layer a material may be used, which is optimal for a second type of radiation or is optimized with respect to its layer thickness for a certain imaging method. The method according to the invention therefore allows to produce different, adjacent, possibly seamlessly adjoining image areas, all image areas having an optimal quality or layer thickness which is due to the use of a plurality of especially adjusted photoresist materials.

In a preferred embodiment in a first procedure stage a negative resist layer is applied onto the substrate and the respective image areas are exposed. Then the substrate is developed, the not exposed areas of the negative resist being removed from the substrate. In a further procedure stage then a second negative resist layer is applied onto the substrate and second image areas are exposed.

The areas already exposed in the first negative resist layer during the first procedure stage are not further exposed during the second procedure stage. By the development of the second resist layer finally the areas of the first resist layer, which were covered by the second resist material, are uncovered. The result is a substrate with two photoresist layers disposed side-by-side having the form of peaks and valleys, in the following referred to as "relief structure". The relief structures in the first and second photoresist layer are formed in the same level and depending on the form of the exposed pattern they seamlessly merge into each another.

In a further preferred method, in a first procedure stage instead of a negative resist a positive resist layer is applied onto the substrate and the respective image areas are exposed with the desired design with the help of the suitable radiation. As to completely remove the positive resist layer in the not exposed areas, in a following step the exposed areas of the first positive resist layer have to be covered with a mask and the not yet exposed areas are intensively postexposed. When the positive resist is developed, the patterns in the positive resist layer exposed in the first step are uncovered and the areas of the substrate postexposed in the second step are completely freed of the positive resist. By this means next to the first positive resist layer there is created space for applying further photoresist layers. The first positive resist layer and the following photoresist layers are located in the same level.

It is obvious that the described embodiments may include further procedure steps, in which further photoresist layers are applied and exposed respectively. Negative resist layers and positive resist layers can be combined with each other in any fashion.

Before the application of each new photoresist layer a thin barrier layer can be applied, which ensures that when the new photoresist layer is dissolved the photoresist layer therebelow is not damaged. The barrier layer preferably is made of an inorganic material, which is not attacked during the development process. But it may be required to remove the barrier layer after it having fulfilled its purpose, in case it would disturb the following procedure steps. Such a removing has to be realizable without the resist layer being damaged. For example metal layers meet this requirement. They are not attacked by resist developers, but can be removed with acids, lyes or etching solutions, which in turn do not attack the resist.

The barrier layer can also have further functions. If for the exposure of one of the photoresist layers for example an electron beam is used, the barrier layer can be formed as a conductive layer so as to divert the electrons after the energy output. Preferably, for this purpose a chromium layer is used. With optical exposure, a layer effectively absorbing light may be required behind the photoresist layer. This, for example, is the case, when the substrate or the layers located below the optical photoresist do not absorb enough light.

The inventive method can be employed particularly advantageous for producing diffraction structures that are used as security features for documents of value or for product protection. Because the inventive method allows to produce a diffraction structure having at least two different image areas, which were produced with different exposure methods. Therefore, the diffraction structure, for example, partly can be formed as a true hologram, while other partial areas are merely formed as a, grating image, which, for example, has been produced by means of electron beam lithography.

For exposing a true hologram, for example, a HeCd laser with a wavelength of 442 nanometer and a highly sensitive photoresist are well suited. When exposing according to the conventional holography method one obtains a relief profile with flat flanks, which can be transferred very well to embossing dies.

However, if the same positive resist is used in order to produce diffraction structures by means of electron beam lithography method, one obtains rectangular relief profiles, which are not suitable for embossing, since the embossed lacquer sticks to the relief profile. In contrast, an only slightly sensitive negative resist working with soft gradation in combination with a respectively adjusted electron beam focus leads to trapezoidal to sinusoidal relief profiles, which can be used very well in an embossing process.

Pure grating images can be produced with different techniques. Depending on the design to be produced, it can be expedient to use different production techniques or types of radiation for different image areas in order to produce an optimal image quality and brilliance of the optically variable effect. Different layer thicknesses in different areas may also be of advantage (in first-order grating images) or necessary (in zero-order grating images). For this purpose the inventive method with the procedure steps described above can be employed likewise. The individual photoresist layers merely have to be applied in the desired layer thickness onto the substrate.

According to a further embodiment of the invention only one photoresist layer is used, which in at least one partial area is exposed with light radiation, such as e.g. laser radiation, and in at least one further partial area is exposed with particle radiation, such as e.g. electron beam. This has the advantage, that grating images, which are produced with different recording techniques, can be produced on one substrate and this substrate as a whole can be further processed to form an embossing tool. The production of different embossing tools and the problems connected thereto thus are eliminated.

The inventive image areas may overlap each other partially or completely. For this purpose, preferably a photoresist layer is used, which at first at least partially is exposed or inscribed with a diffraction structure and subsequently in the same area with a second or a plurality of diffraction structures.

For the described methods according to the invention, preferably a neutral carrier material, such as a glass plate, is used, onto which the individual photoresist layers are applied, and then are exposed and developed there. The substrate produced in this way, the so-called "resist master", subsequently is galvanically molded and according to known methods duplicated, so as to produce an embossing tool, such as for example an embossing cylinder.

Alternatively, instead of the neutral carrier material a plastic foil or metal foil or a galvanic shim already provided with a grating image can be used. This grating image preferably has the form of a relief structure. For producing this intermediate product a neutral carrier material, such as e.g. a glass plate, is coated with a first photoresist layer and exposed with the respective grating image or parts of the grating image by means of laser or electron beam. This resist master is galvanically molded. Subsequently, either the galvanic shim produced in this way or a plastic foil or metal foil, which were embossed with the grating image by means of an embossing tool produced with the help of this galvanic shim, are coated with a further photoresist layer. This photoresist layer, too, is exposed or inscribed by means of electron beam with a grating image or parts of a complete grating image. Depending on the type of photoresist used it may be necessary to take further measures after the development of the photoresist, which ensure that the respective image areas of the first grating image are uncovered.

If, for example, a positive resist is used, this resist layer is left all-over on the carrier material, while the structuring is present only in the exposed area. Therefore, the not exposed areas then have to be removed. For this purpose, for example, the exposed areas can be provided with a metallization via masks or with the help of a so-called washing method. With the washing method all unexposed areas are printed with a preferably water-soluble printing ink and the carrier material subsequently is metallized all-over. When the printing ink is dissolved, the metallization thereabove is removed too, the metallization is left merely in the exposed areas. This protects the exposed areas even in the following process of dissolving the photoresist layer, which is removed only in the not exposed areas, for example by means of acetone. In a last step the metallization may also be removed. This substrate, too, forms a resist master, which, as already described, is further processed.

A further alternative provides that onto the already structured carrier material, i.e. the embossed foil or the shim, an embossable lacquer layer, e.g. a UV lacquer layer, or a thermoplastic layer is applied, into which with a second embossing tool the desired grating image is embossed. This substrate, too, forms a resist master, which, as described, is further processed to form an embossing tool. It is obvious that this operation can be repeated as often as desired. The proceedings described last beside the optimal adjustability of the photoresist layers to the type of grating image or recording method have the great advantage, that an already existing grating image can be supplemented and/or individualized by additional information.

The two proceedings described last are expedient when e.g. for a bank note series an optically variable security element is to be produced, which in the background shows a grating image identical in all denominations, such as e.g. the symbol of a country, and in the foreground shows a symbol individual for each denomination, such as e.g. the denomination itself.

By means of the embossing tools produced according to the invention security elements can be produced, which are used for protecting documents of value, such as for example bank notes, checks, ID cards or the like. In the field of product protection, too, embossed diffraction structure elements are often used.

With the help of the method variants according to the invention for the first time zero-order grating images and first-order grating images or grating images produced with the help of particle radiation and by optical exposure can be combined in any fashion in one resist master.

BRIEF DESCRIPTION OF THE DRAWINGS

In the following the invention is described by way of example with reference to the accompanying figures.

FIG. 5 shows the pattern for a holographic exposure;

DESCRIPTION OF VARIOUS EMBODIMENTS

FIG. 1a to 1d show procedure steps of the method according to the invention, wherein at first a photoresist layer 1 is applied onto a substrate 2. The substrate 2 can be, for example, a glass plate, which, if an optical holographic exposure is to be effected, preferably is colored black as to avoid reflections. The application of the photoresist layer 1 is effected, for example, by putting onto the substrate 2 one drop of the photoresist material, which in a resist spinner, e.g. a centrifuge, is evenly distributed over the substrate 2. Then the photoresist layer 1 is cured by heating.

The thickness of the resulting photoresist layer 1 depends on the drop size, spinning speed and spinning duration, temperature, vapor pressure and other parameters. If optical diffraction structures are to be incorporated into the photoresist layer 1, the thickness of the photoresist layer 1 is in the range of 100 and 1000 nanometer.

In the following the method according to the invention is explained with reference to the example of producing diffraction structures in a holographic fashion. In the example shown in FIG. 1, a negative resist layer is used as a photoresist layer 1.

Figure 1A:
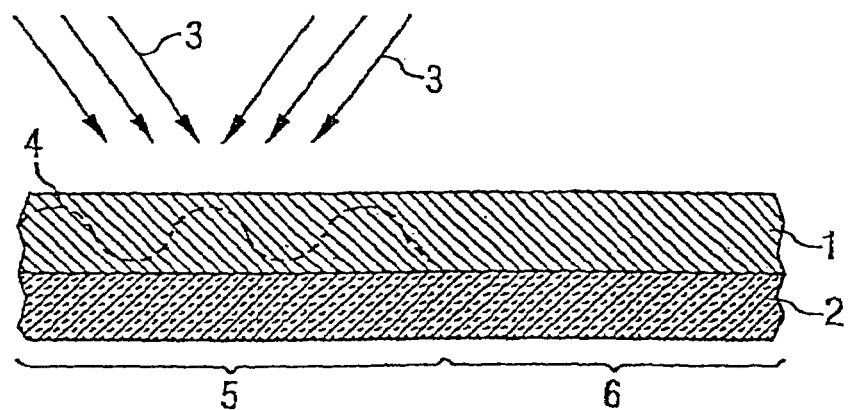
FIG. 1a-d show successive procedure steps when negative resist layers are used.
Figure 1B:
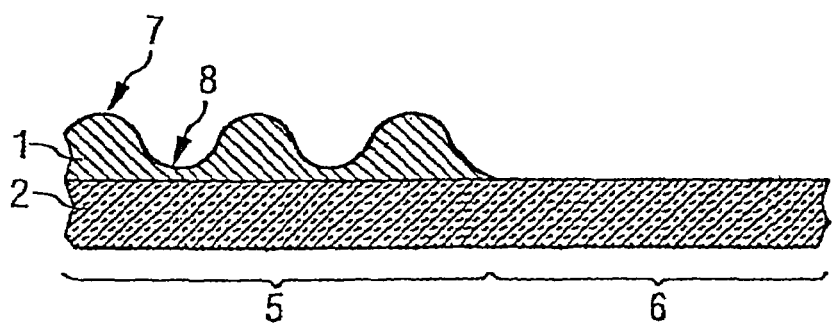

After the curing this negative resist layer 1 is exposed with uniform coherent wave fields 3, which interfere in the area of the negative resist layer 1 and form an interferential pattern 4 in the negative resist layer 1 as indicated by dash lines in FIG. 1a. The negative resist material and the radiation used are optimally adjusted to each other. The exposure with the wave fields 3 is executed such that the interferential pattern 4 is formed merely in the area of a first image area 5, while a second image area 6 remains unexposed. This can be achieved, for example, by using masks. The outlines of the image areas 5 and 6 each are selected corresponding to the motif represented by the image areas 5 and 6.

When developed the unexposed areas of the negative resist layer 1 are dissolved. Corresponding to the interferential pattern 4 the negative resist layer 1 now has peaks 7 and valleys 8, which in the shown example are formed regularly sinusoidal. Depending on the image motif to be represented the relief structure can also be of any complicated design. This in particular is the case with true holograms. In the area of the image area 6 the negative resist layer 1 is completely dissolved by the development operation, so that the substrate 1 in this area again is uncoated.

Figure 1C:
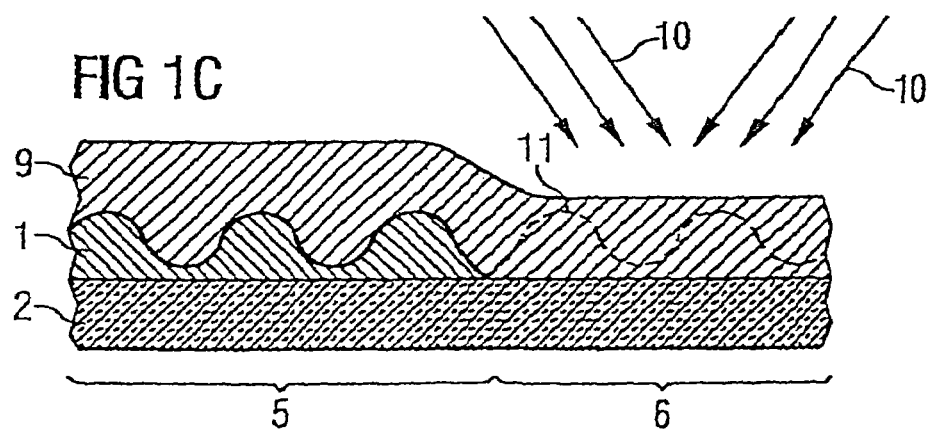

Then according to FIG. 1c, a second negative resist layer 9 is applied all-over onto the substrate 2, so that it covers also the first negative resist layer 1. This second negative resist material 9 is optimally adjusted to the type of radiation used for the exposure. As indicated in FIG. 1c, the second negative resist layer 9 in the image area 6 is exposed with coherent wave fields 10, the wavelength of which, however, differs from, for example, the radiation used for the exposure of the first negative resist 1. In the image area 6, too, an interferential pattern 11 is formed, which is indicated by dash lines.

Figure 1D:
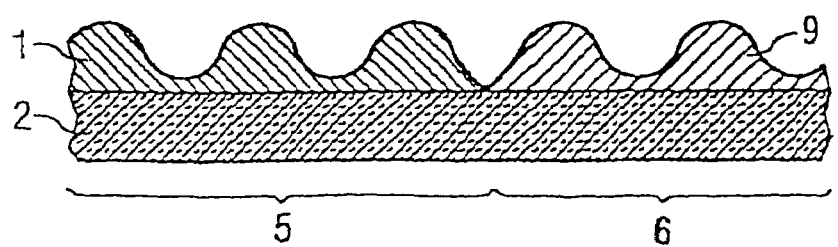

The substrate 2 is developed again. The result is shown in FIG. 1d. Since it is a negative resist, when developed the exposed areas of the negative resist layer 9 are left there. In the areas not exposed by the wave fields 10 the photoresist layer 9 is removed. In particular those areas of the first photoresist layer 1 that were covered by the second photoresist layer 9 are uncovered. In the shown example the different image areas 5, 6 directly adjoin each other. It is obvious, that they can also be disposed at a distance to each other.

When further separate image areas are to be formed beside the image areas 5 and 6 that are represented in the FIG. 1a to d, in the procedure steps according to FIG. 1a to 1d the respective areas of the substrate 2 remain uncovered by not exposing them. In further procedure steps then the procedure is such as shown in FIG. 1c and 1d.

For the method not only negative resist layers can be used, but also positive resist layers. FIG. 2a to 2f show the respective procedure steps of the method according to the invention in the case positive resist layers are used.

Figure 2A:
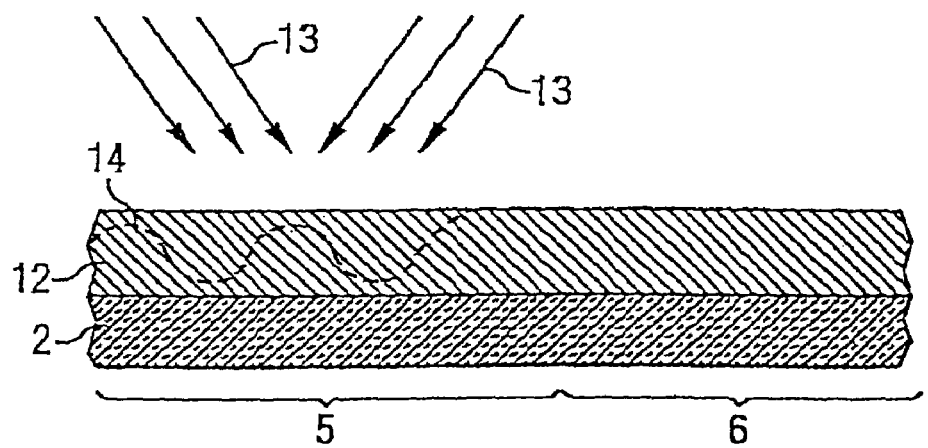
FIG. 2a-f show successive procedure steps when positive resist layers are used.

In a first procedure step, as shown in FIG. 2a, the substrate 2 is coated with a positive resist layer 12. Then in the area of the image area 5 the positive resist layer 12 is exposed with coherent wave fields 13. In the positive resist layer 12 these wave fields 13 interfere and form an interferential pattern 14 as shown by dash lines in FIG. 2a. The material of the positive resist layer 12 is adjusted to the type of radiation of the wave fields 13.

Figure 2B:
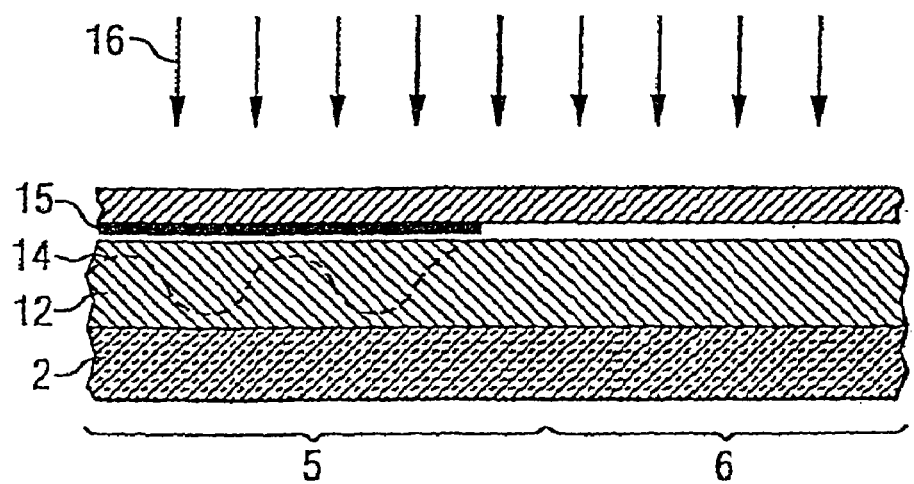

The exposed areas of the positive resist layer 12 are covered with a mask, which is formed by a transparent foil having lighttight masked areas 15 (FIG. 2b). Areas of the positive resist layer 12 not yet exposed until then, which in following procedure steps are intended for further image areas 6, are intensively postexposed all-over with the help of radiation 16 according to FIG. 2b.

Figure 2C:
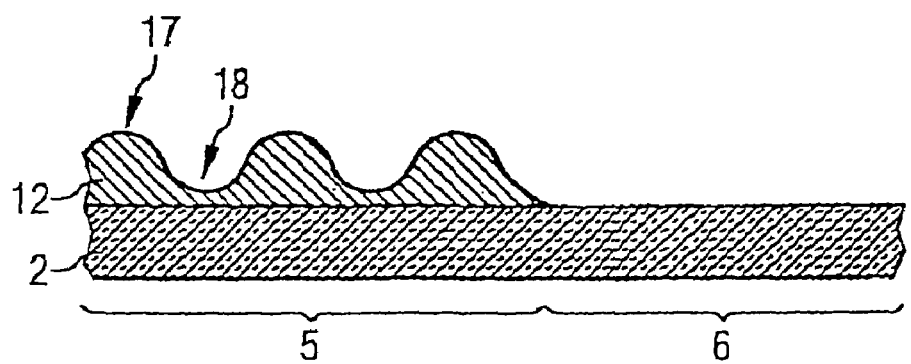
Figure 2D:
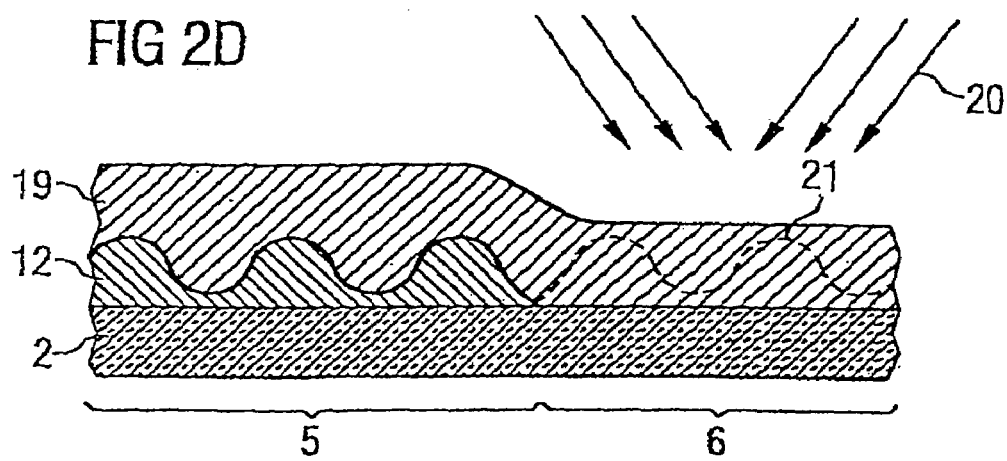

After the development of the substrate 2 and the removal of the exposed areas the result is the relief structure of the positive resist layer 12 as shown in FIG. 2c. The positive resist layer 12 now has a relief profile with peaks 17 and valleys 18 corresponding to the interferential pattern 14, which here for clarity's sake is merely represented as sinusoidal relief structure. In order to provide the image area 6 with a diffraction structure, onto the substrate 2a second positive resist layer 19 is applied. The second positive resist layer 19 is exposed with wave fields 20, which in the image area 6 in the positive resist layer 19 form an interferential pattern 21 shown in FIG. 2d by dash lines. The material of the positive resist layer 19 is adjusted to the type of radiation of the wave fields 20.

Figure 2E:
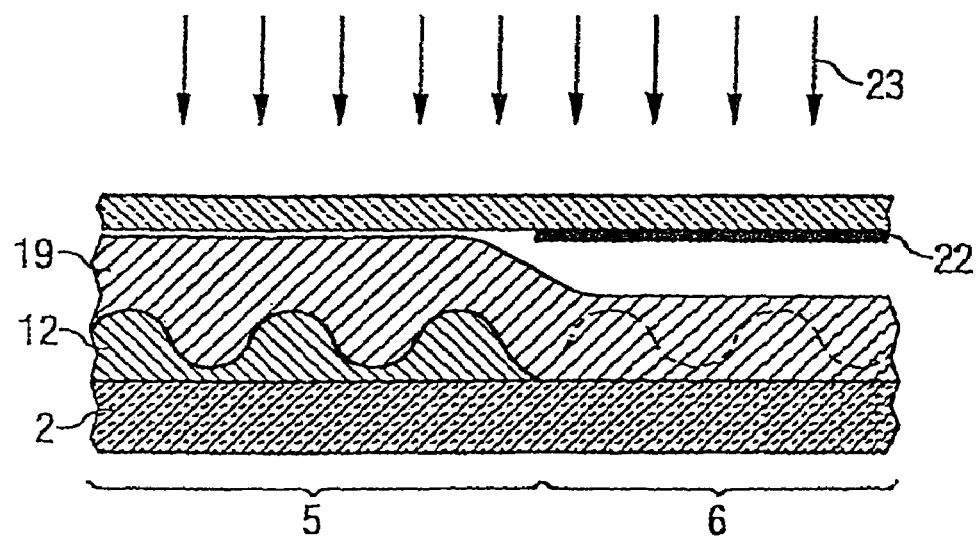

In a further procedure step as shown in FIG. 2e the areas of the positive resist layer 19 exposed with the wave fields 20 again are covered with a mask 22, and the image area 5 as well as possible further not shown image areas are intensively exposed all-over with radiation 23.

Figure 2F:
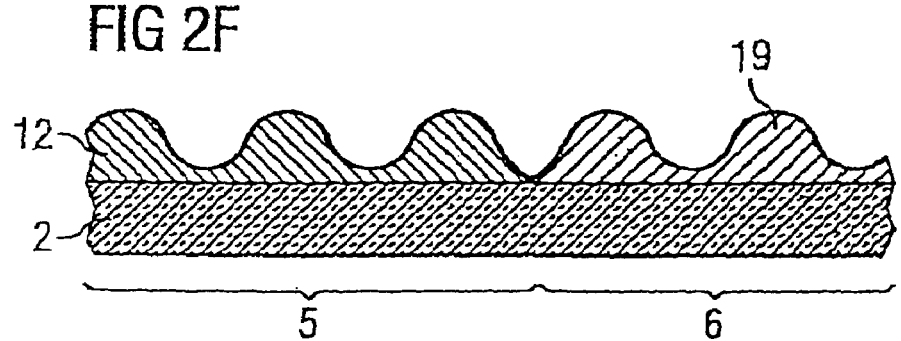

Finally, the substrate 2 is developed and the exposed areas are removed, so that the result are the relief structures on the substrate 2 as shown in FIG. 2f.

With the methods described with reference to FIG. 1a to 1d and 2a to 2f one obtains photoresist layers 1, 9, 12, 19 each lying side-by-side in the same level, i.e. directly on the substrate, the materials for the photoresist layers each being selected with regard to the radiation used for the exposure as to achieve optimal results.

It should be mentioned that the positive and negative resist layers can also be combined with each other. For example, subsequently to the procedure steps according to FIG. 1a and 1d the further procedure steps as shown in the FIG. 2d to 2f may follow.

In certain embodiments it can be expedient to apply a thin barrier layer or auxiliary layer, e.g. made of metal, oxide or the like, before the application of a new photoresist layer, which ensures that when the new photoresist layer is dissolved the photoresist layer therebelow is not damaged. Preferably, the barrier layer is made of inorganic material, which is not attacked in the development operation.

The auxiliary layer may also fulfill further functions. If for the exposure of one of the photoresist layers an electron beam is used, this layer preferably, is formed as a conductive layer, so as to be able to divert the electrons after the energy output. In this case the barrier layer preferably is a chromium layer. With an interference exposure, however, it can be formed as a strongly absorbing thin layer.

The invention is not restricted to methods, wherein the exposure by means of light radiation and particle radiation is combined. E.g. different wave lengths can also be used for the exposure processes.

Any types of grating images, such as first-order and zero-order grating images, can be combined with each other likewise.

Figure 3A:
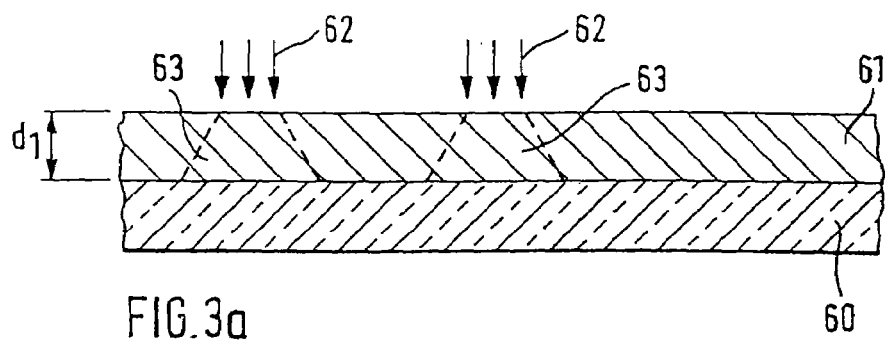
FIG. 3a-d show a further embodiment with two negative resist layers of different layer thickness.

FIG. 3a to 3d show an embodiment of the invention, in which the substrate is provided with two different image areas, which are characterized by different profile depths. This is the case for example with zero-order grating images, which show different optical effects. For this purpose in a first step, as shown in FIG. 3a, a glass plate 60 is provided with a first negative resist layer 61. Since the profile depth solely depends on the resist layer thickness, the resist layer thickness has to be exactly adjusted. In the shown example the resist layer thickness $d_1$ may amount to 200 nanometer. When for the exposure with the radiation 62 an electron beam is used, before the application of the negative resist layer the glass plate 60 may be sputtered with a chromium layer. The thickness of this layer amounts to about 20 nanometer. The negative resist layer 61 then is exposed with the radiation 62 such that trapezoidal exposed areas 63 are the result.

Figure 3B:
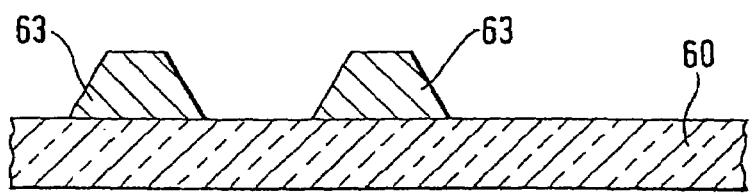
Figure 3C:
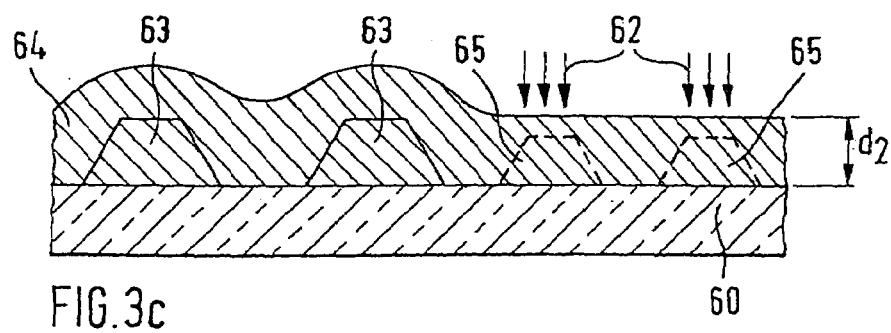
Figure 3D:
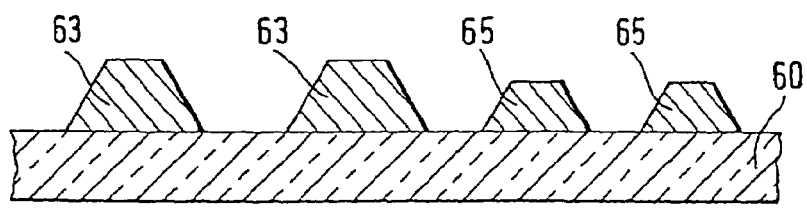

Subsequently, the negative resist 61 is developed, the not exposed areas being dissolved away and only the exposed areas 63 remaining on the glass plate 60, as shown in FIG. 3b. Then a second negative resist layer 64 is applied onto the glass plate 60. The layer thickness $d_2$ of this second negative resist layer 64 amounts to 150 nanometer. This layer is exposed with the same radiation 62, preferably with an electron beam. Here the exposure takes place in the areas 65 neighboring the areas 63. This negative resist 64 then is developed, the not exposed areas being dissolved away, so that only the exposed areas 63 and 65 are left on the glass plate 60. The areas 63, 65 are characterized by different profile depths $d_1$, $d_2$, which in particular with zero-order diffraction gratings lead to different optical effects.

It is obvious that this method can also be carried out using positive resist layers or a combination of positive and negative resist layers, such as already explained with reference to the above Figures. Likewise, it is possible to dispose any first-order grating image in one of the image areas.

Figure 4:
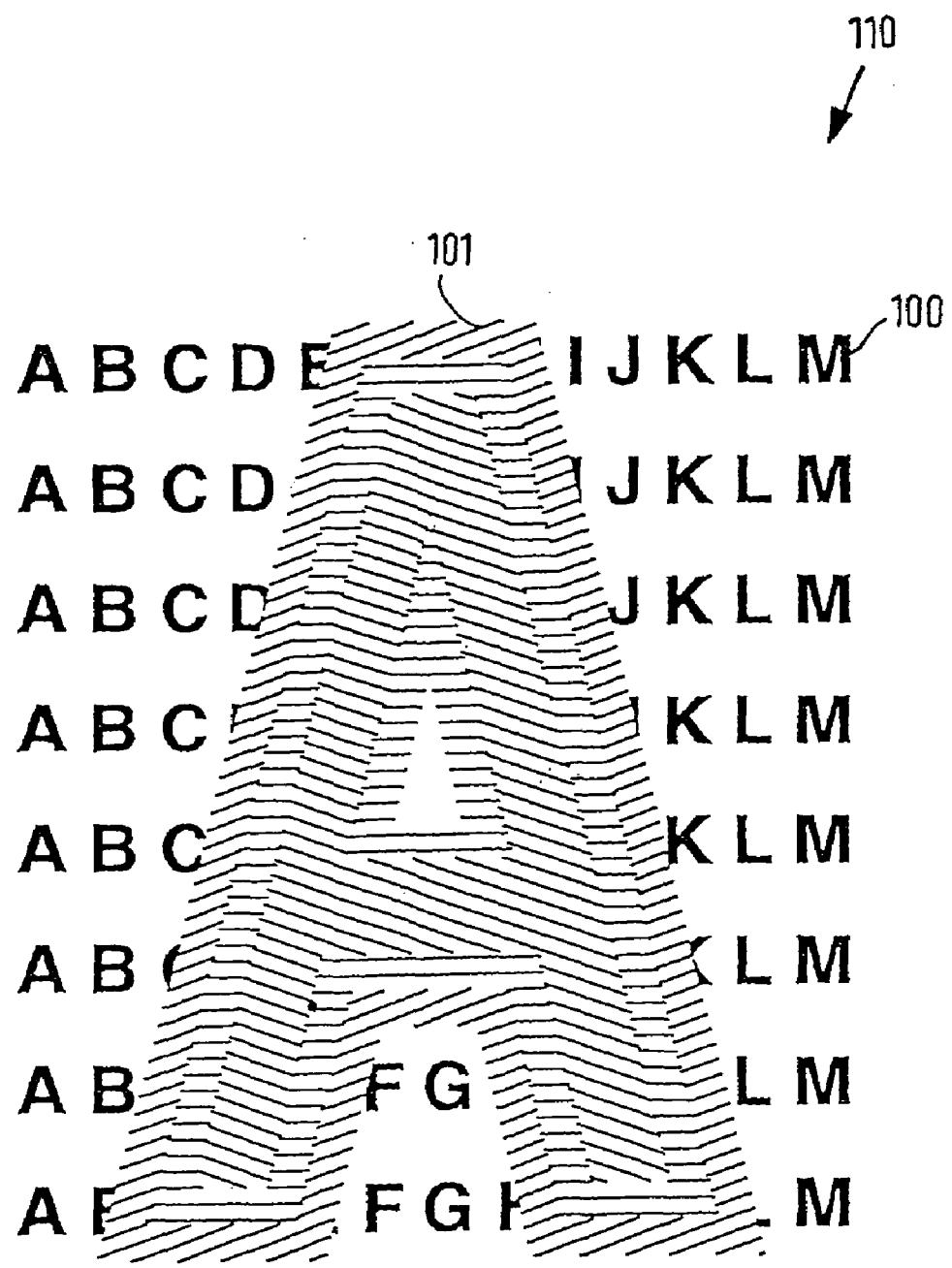
FIG. 4 shows a resist master according to the invention in a top view.

FIG. 4 schematically shows a resist master 110 according to the invention for an embossed hologram, which has a first image area 100, which is exposed with light radiation, and a second image area 101, which is exposed with particle radiation. In the shown example the optically exposed image area 100 has a true hologram, which represents a field of letters disposed in the background. The image area 101 produced with particle radiation has the form of a letter "A", which when the image is tilted seems to pulsate and which is produced by means of electron beam lithography. It is obvious that the motifs can be selected as desired. The different image areas may be interlaced with each other in any fashion.

The letter field 100 produced in a holographic fashion, i.e. by overlapping coherent light radiation, is interrupted in the area 101 or has a gap 101 there. In this gap 101 is disposed a letter "A" produced with particle radiation, in particular electron beam, which is composed of different strip-shaped grating structures, which is schematically shown by the different hatchings.

In the following various method variants are described, with the help of which such a resist master 110 according to the invention can be produced.

Figure 5:
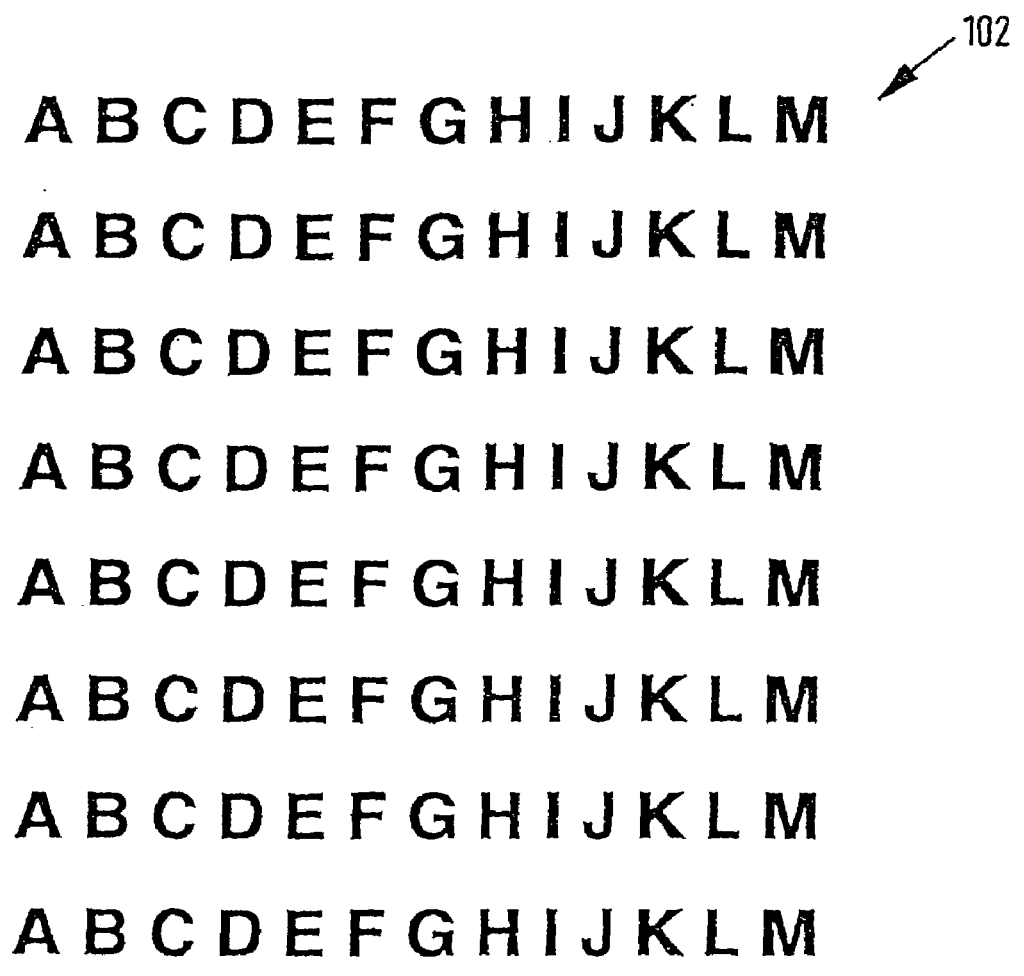
Figure 6:
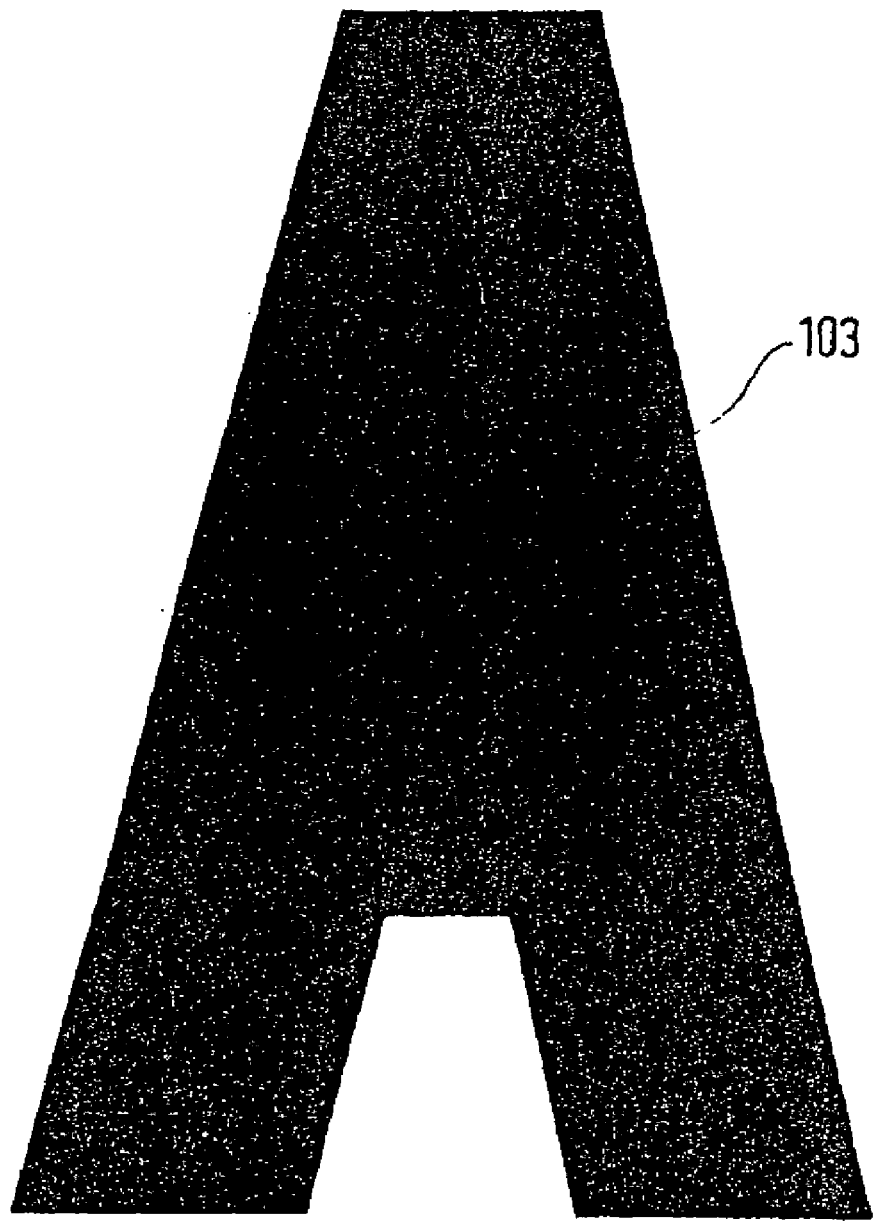
FIG. 6 shows an example for a mask.
Figure 7:
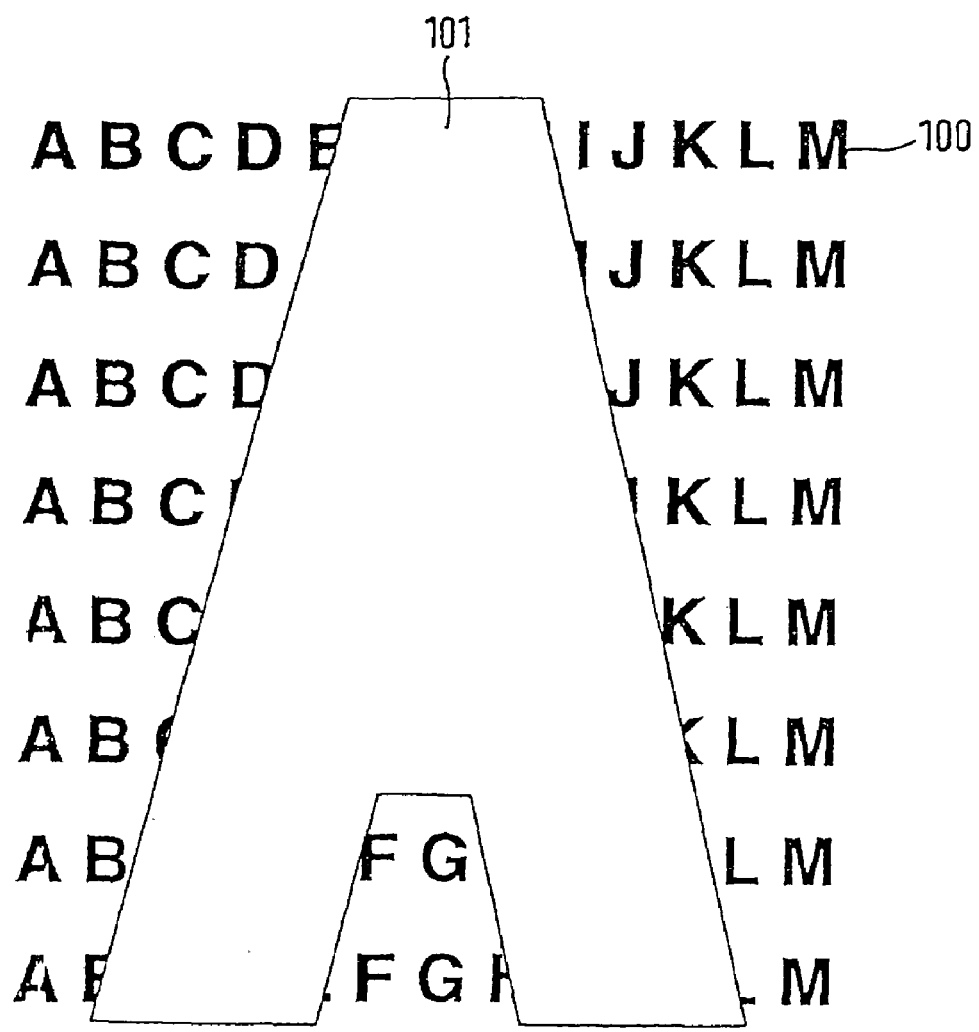
FIG. 7 shows the holographic exposure with the pattern according to FIG. 5 and the mask according to FIG. 6.

According to a first method for producing the holographic background a pattern 102 as shown in FIG. 5 is used. This pattern 102 is optically exposed in a photoresist layer, a mask 103 in the form of a letter "A" being used. The mask 103 is schematically shown in FIG. 6. The mask 103 prevents the holographic exposure of the photoresist layer in the area 101 and only the background is exposed with the letter field 100. This is shown in FIG. 7. Then the grating structure shown in FIG. 4 is written into the omitted, not exposed area 101 by means of an electron beam. It is obvious that the order of the exposure steps can be changed. As explained in detail in the following, one photoresist layer or a plurality of photoresist layers may be used for the production of this resist master 110.

Figure 8A:
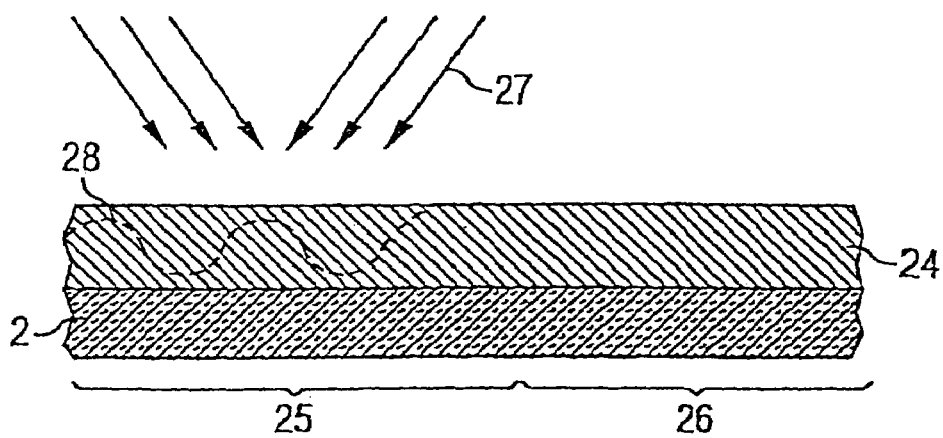
FIG. 8a-f show successive procedure steps of a method, wherein at first in a first procedure step a positive resist is exposed in a holographic fashion and subsequently a negative resist is exposed with the help of an electron beam.

A first embodiment, in which two photoresist layers are used, is explained in more detail with reference to FIG. 8a to 8f. Here a black-colored glass plate which serves as a substrate 2 is coated with a positive resist layer 24 made of the positive resist material A-RP 3040 with a layer thickness of approximately 0.50 micrometer. In a conventional holographic apparatus having an for example HeCd laser, the positive resist layer 24 is exposed in the area of the background 25 with the help of the conventional rainbow hologram H1/H2 method, while those areas intended for the foreground 26, i.e. the electron beam grating image, remain unexposed. In FIG. 8a this apparatus is only indicated by laser radiation 27. Furthermore, it is pointed out, that for clarity's sake only a small partial section of the substrate is shown.

Figure 8B:
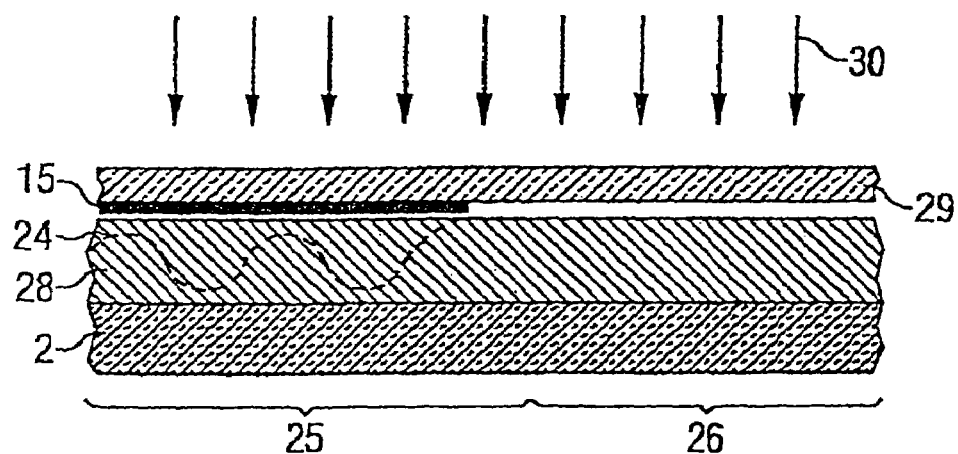

According to FIG. 8b now a mask, such as e.g. shown in FIG. 6, is brought into contact with the substrate 2. The mask is a transparent foil 29 with lighttight masked areas 15, which covers the parts of the image intended for the background 25 and leaves uncovered the areas intended for the foreground 26. The substrate 2 now is postexposed with homogenous UV light 30.

Figure 8C:
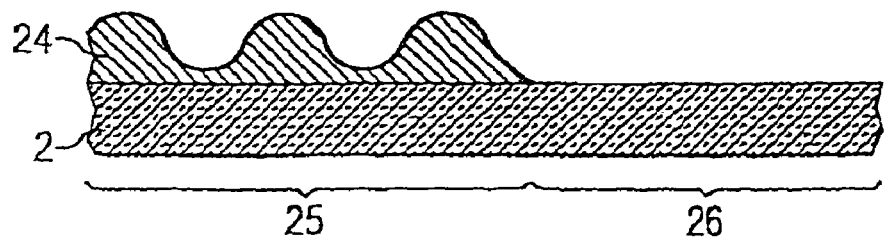
Figure 8D:
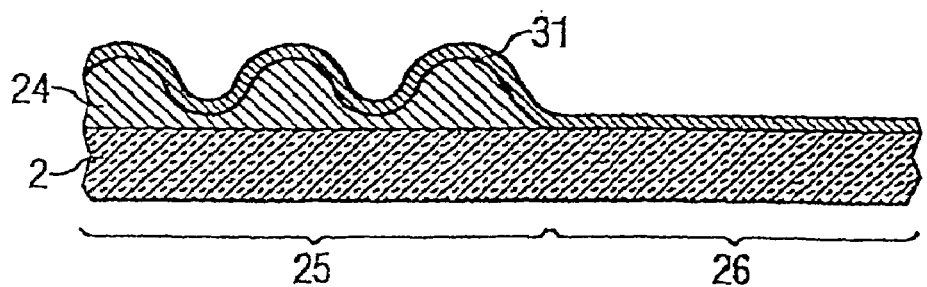
Figure 8E:
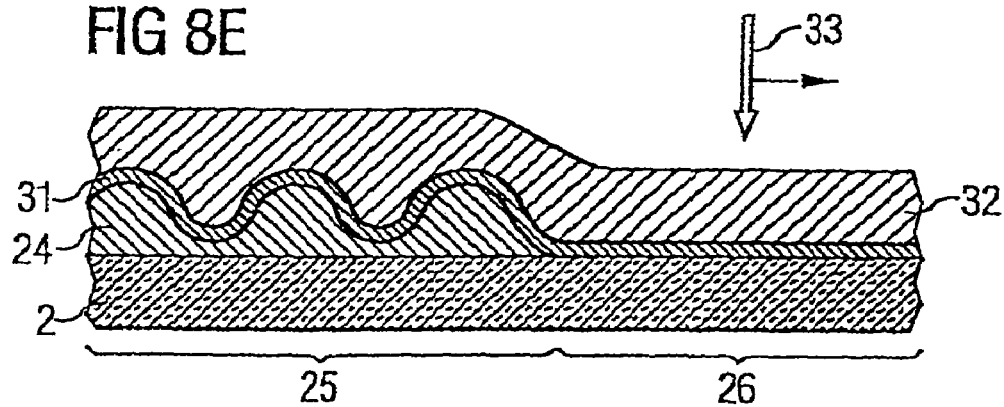
Figure 8F:
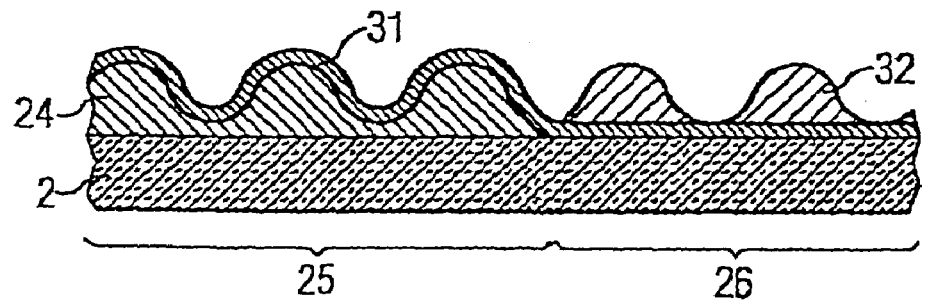

After the development of the substrate 2 in the developer AR 300-35 the relief profile 24 schematically shown in FIG. 8c is the result. Then a chromium layer 31 of a thickness of 30 nanometer is vapor-deposited as shown in FIG. 8d. Then, as shown in FIG. 8e, onto the chromium layer 31 is applied a negative resist layer 32 made of the negative resist material X AR-N 7720/25 with a thickness of 300 nanometer. Into the such intended area 26 the foreground is written as a grating image 101 with electron beam lithography, as shown in FIG. 8e. For this purpose an electron beam 33 is guided along the provided grating lines. The electron beam 33 in a way writes the grating lines into the negative resist layer 32. The completely exposed substrate 2 is developed in the developer AR 300-48. The result is the relief profile 32 as shown in FIG. 8f.

FIG. 9 shows an example, in which the layers are not applied alternately in the individual processing steps, but in which all layers are already present at the beginning of the process and the exposures can be performed successively without further coating operations.

Onto a glass plate 40, preferably a cut quartz glass plate, a chromium layer 41 is applied. Onto this chromium layer a darkly colored positive resist 42, to a large extent insensitive to optical radiation, is applied, which is suitable for an exposure with electron beam and has a layer thickness suitable for the exposure by electron beam of e.g. 200 nanometer.

Figure 9A:
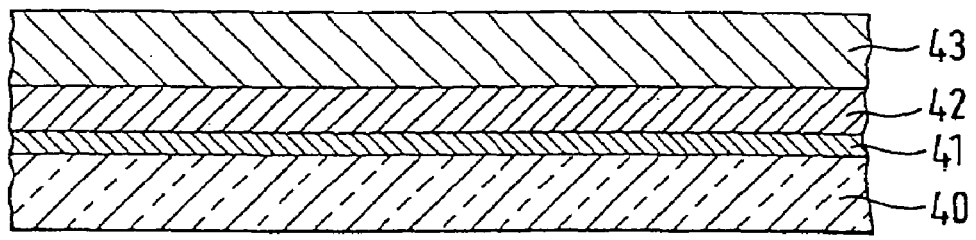
FIG. 9a-e show a further embodiment of the method according to the invention with photoresist layers lying one above the other.

Thereabove a layer of positive resist 43 with a thickness of 400 nanometer is applied, which has a good sensitivity to light radiation, e.g. for the light of a HeCd laser with the wavelength 442 nanometer. With that the plate is prepared for the exposure (FIG. 9a).

Figure 9B:
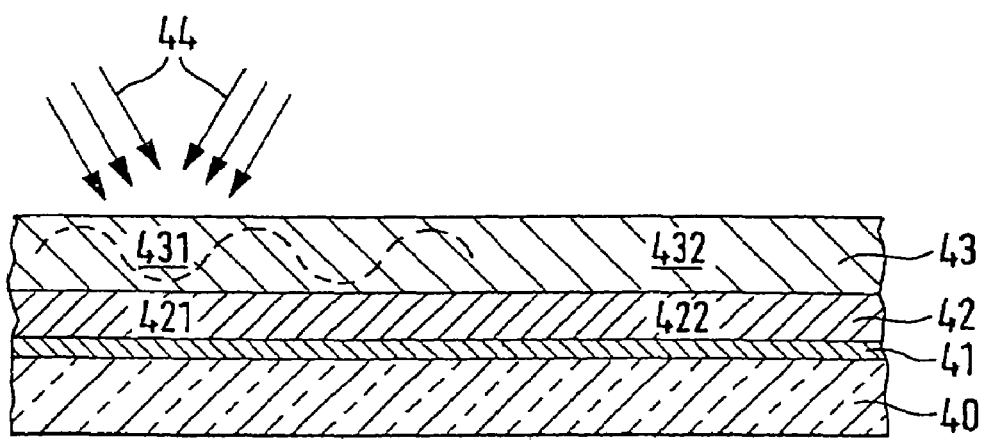

The order of the exposure steps now required can be selected in any fashion. The shown example starts with the optical exposure. The such intended area 431 is holographically exposed with a HeCd laser 44. The area 431 exposed in this way now contains the latent holographic image, which is indicated in FIG. 9b by a dashed sinusoid.

Figure 9C:
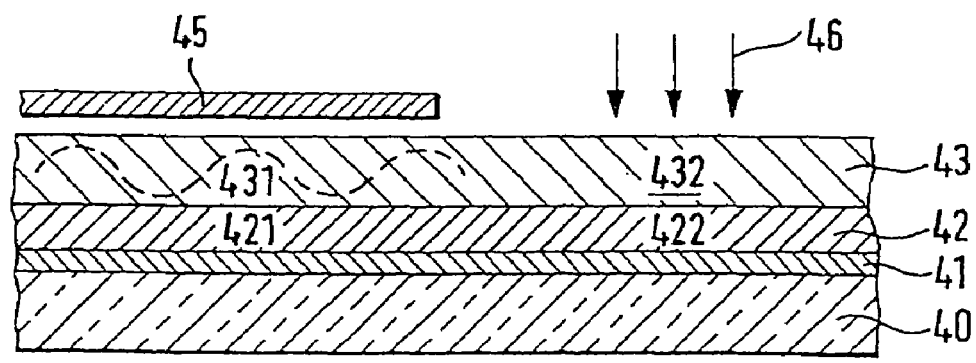
Figure 9D:
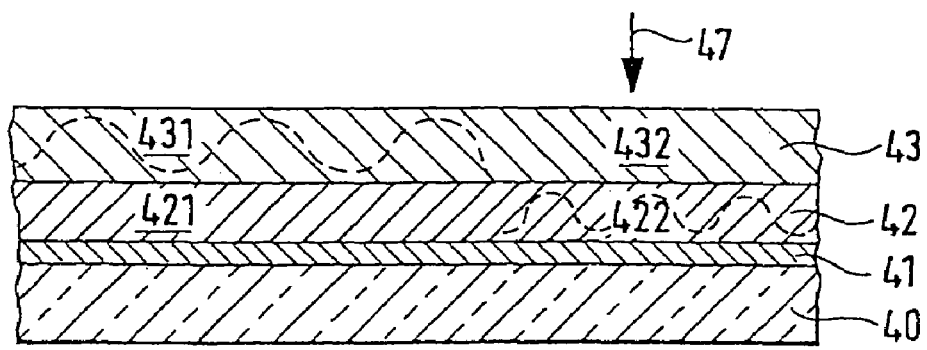
Figure 9E:
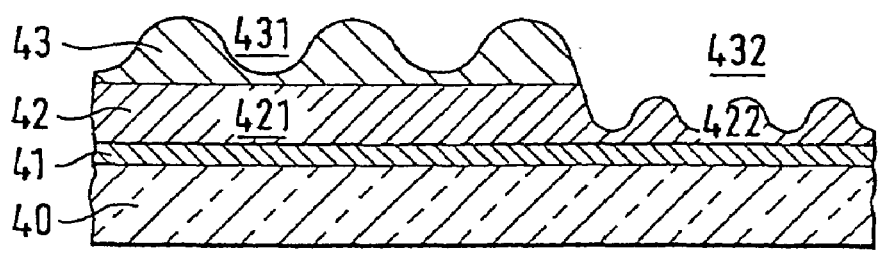

The photoresist area 421 located therebelow due to its optical insensitivity is not damaged and with its dark color serves as an absorbing layer so as to avoid undesired light reflections. The area 431 optically exposed in this way now is covered by a mask 45 and the area intended for the exposure by electron beam at first is pre-exposed all-over with blue light 46, so as to make soluble the topmost photoresist layer in the area 432. The action of the blue light 46 due to the insensitivity to light of the photoresist layer 42 has no effect on the photoresist layer area 422 located therebelow (FIG. 9c). Then the exposure by electron beam 47 is effected in this area (FIG. 9d).

The electron beam penetrates the upper photoresist layer 43 and exposes the electron beam resist layer 42 located therebelow with the desired grating image. The damage, which is caused by the electron beam in the topmost photoresist layer 43, is irrelevant, since this layer in this area is removed in the end. With that the exposure process is completed.

By developing, peak-and-valley profiles are formed out of the latent images (FIG. 9.e), which is due to the exposure. The area 431 shows a holographic image, the area 421 is undamaged, since it was not exposed. The area 432 is removed, since it was exposed all-over, and the area 422 shows an electron beam-grating image.

Figure 10:
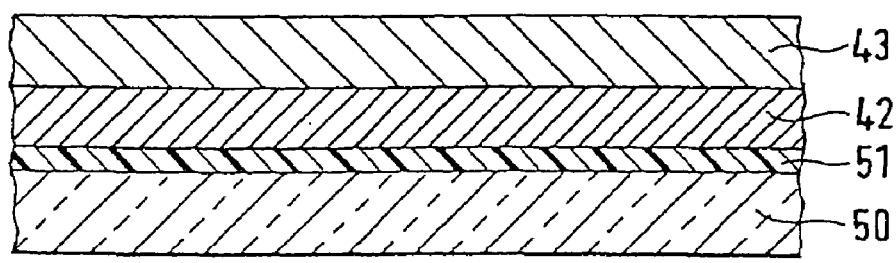
FIG. 10 shows a further embodiment.

FIG. 10 shows an alternative structure, which is treated in the same way as in FIG. 9. The difference is that instead of the chromium layer 41 a conductive polymer layer 51 is applied and a black-colored glass substrate 50 is used. This structure leads to an even better suppression of reflections in the optical exposure than in the structure according to FIG. 9.

Figure 11A:
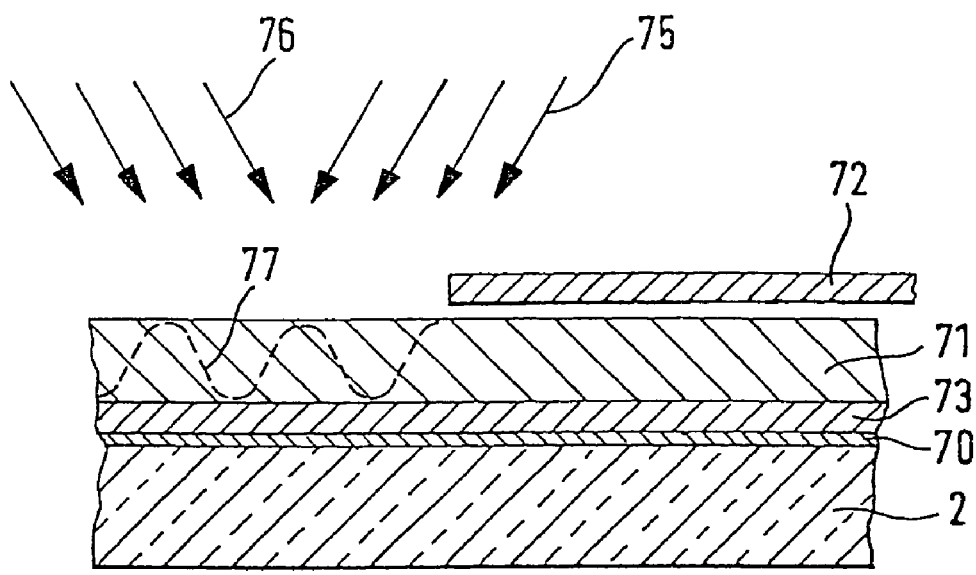
FIG. 11a-c show a further embodiment of the invention having a photoresist layer made of positive resist.
Figure 11B:
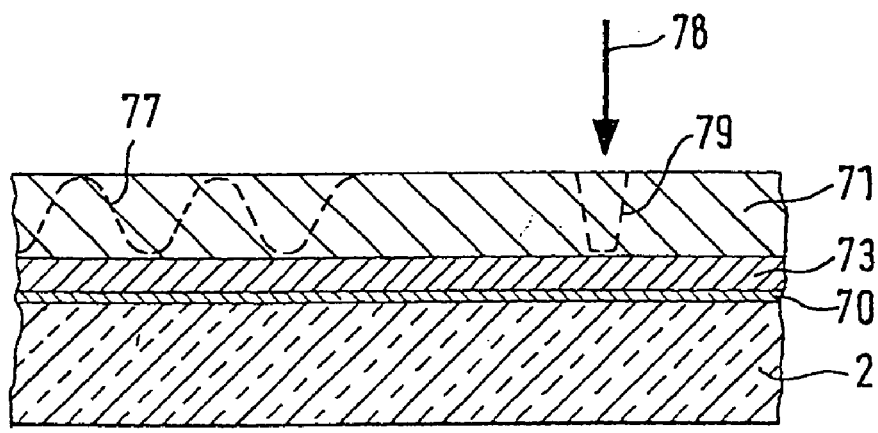
Figure 11C:
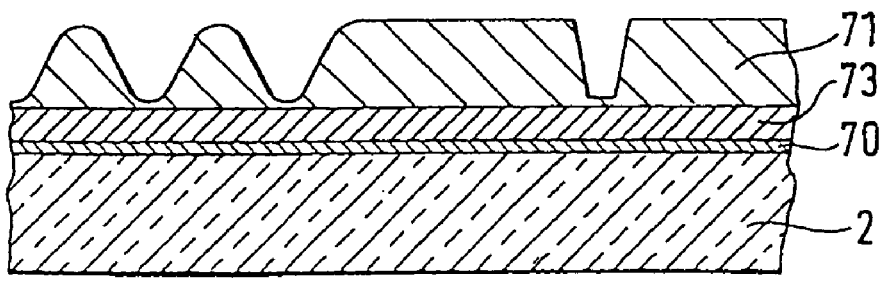

The diffraction structure pattern shown in FIG. 4 and already explained there, consisting of a holographic exposure 100 and a grating structure 101 produced by means of electron beam, can also be produced by the exposure of only one photoresist layer. This case is shown in FIG. 11a to 11c. Before the exposure the substrate 2 is provided with a metal layer 70, thereabove a dark absorbing layer 73 and a photoresist layer 71 are applied. For holographically exposing the background pattern 100 this photoresist layer 71 is partially covered with a mask 72. The mask 72 schematically shown in FIG. 11a for example has the form as shown in FIG. 6. The area of the photoresist layer 71 not covered by the mask 72 then is exposed, as shown in FIG. 11a, by means of overlapping two coherent light beams 75, 76. The object beam 76 carries the information of the letter field 102, which is shown in FIG. 5. By overlapping the object beam 76 with the reference beam 75 in the photoresist layer 71 is formed the holographic diffraction structure 77 in the form of the letter field 100, which as shown in FIG. 7, in the area 101 has a gap. This gap 101 is covered by the mask 72 and, therefore, at this point of time in the method not yet exposed. Then the mask 72 is removed and the grating structure 79 is written into this area of the photoresist layer, which has not yet been exposed until this point of time, with the help of an electron beam 78. This procedure step is shown in FIG. 11b. In this procedure step the metal layer 70 ensures a diversion of the electrons of the electron beam 78. The dark absorbing layer 73 ensures that disturbing light reflections whatsoever do not occur during the holographic exposure. If the photoresist layer 71 used in the procedure steps 11a and 11b is a positive resist, the photoresist layer 71 after the development will have the relief structure as shown in FIG. 11c.

Figure 12:
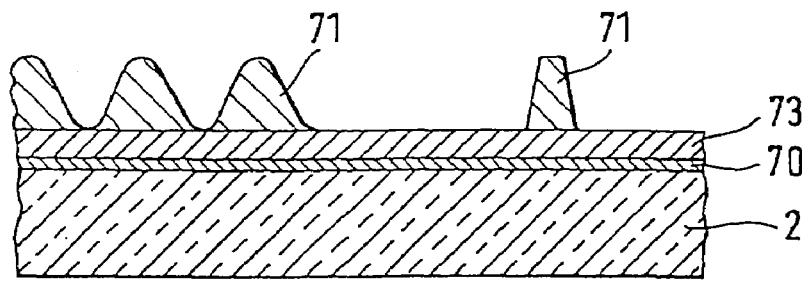
FIG. 12 shows a negative resist exposed according to the method according to FIG. 11a, 11b.

If, however, for the procedure steps according to FIG. 11a and 11b a negative resist is used, after the development this negative resist will have the relief structure as shown in FIG. 12.

Figure 13:
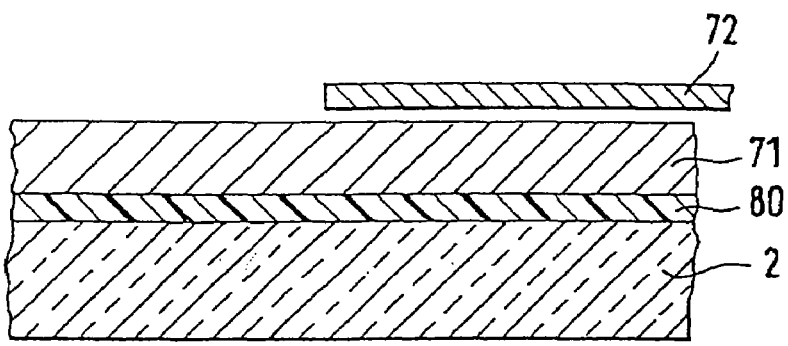
FIG. 13-15 show various layer structures, which can be used in the method as shown in FIG. 11.
Figure 14:
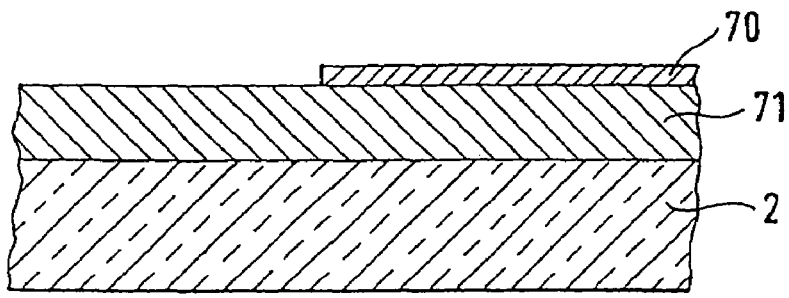
Figure 15:
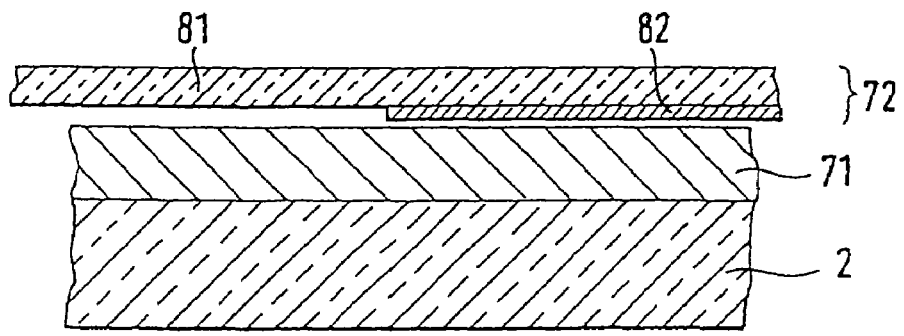

FIG. 13 to 15 show various layer sequences, which may be disposed onto the substrate 2 and may be used in the methods as shown in FIG. 11. For example, the dark absorbing layer 73 may be omitted, when a darkly colored glass is used as a substrate layer 2. Instead of the metal layer 30 a conductive polymer 80 may be used (FIG. 13). It is also possible that the metal layer 70 is used as a diversion layer and at the same time as a mask. This case is shown in FIG. 14. As a substrate 2 here also a dark-colored glass may be used. According to a further alternative (FIG. 15) the mask 72 can have a multilayer structure and consist of a glass plate or plastic film 81, onto which the masking metal layer 82 is applied in a separate procedure step. The structuring of the metal layer 82 here may be effected by means of known washing methods or etching methods. This mask 72 is put onto the photoresist layer 71. Here it can be helpful to dispose a glycerine layer intermediate between the mask 72 and the photoresist layer 71, so as to avoid reflections on the surface of the photoresist layer. Instead of glycerine a different suitable substance can be used likewise, which has roughly the same refractive index as the photoresist layer 71 and the glass layer 81.

An alternative method for producing the resist master 110 according to FIG. 4 is shown in FIG. 16a to 16d. Here the use of masks is abandoned, so that the produced diffraction structures 100, 101 overlap each other. That means, the diffraction structure 101 forming the foreground is disposed on top of the letter field 100 and in this image area replaces the letter field forming the background.

Figure 16A:
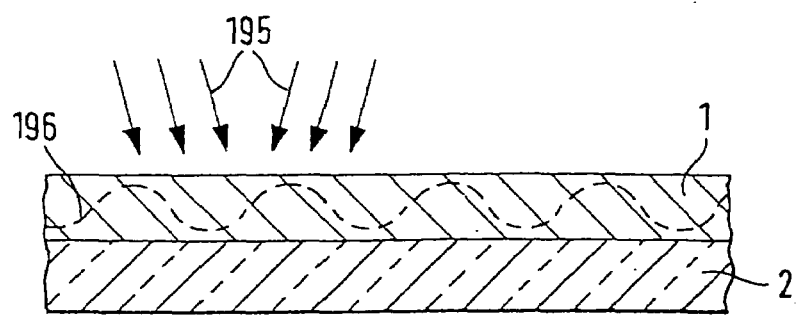
FIG. 16-18 show further embodiments of the method according to the invention.
Figure 16B:
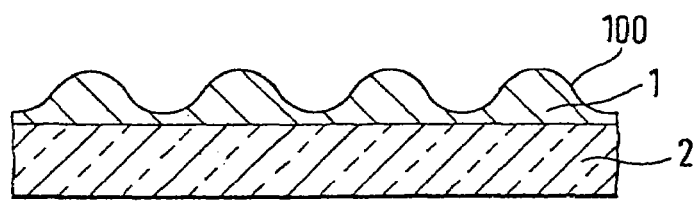
Figure 16C:
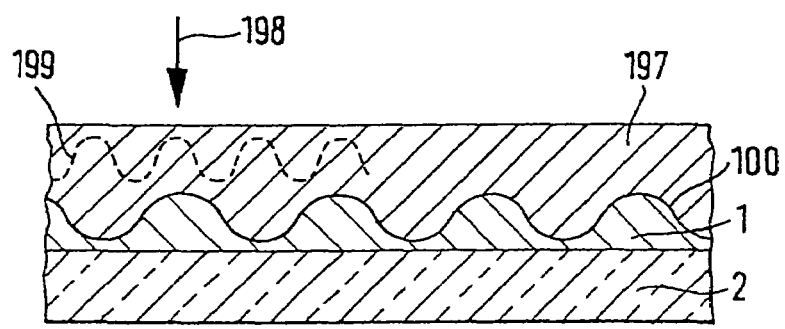
Figure 16D:
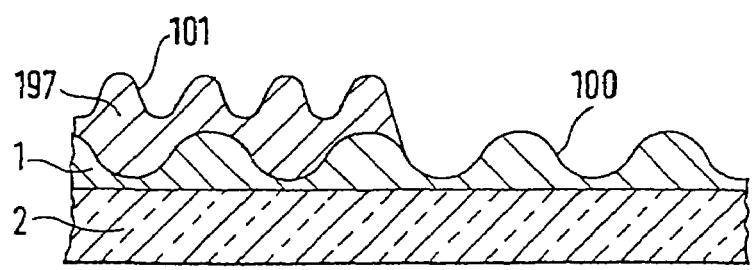

In FIG. 16a a substrate 2 coated with a photoresist 1 is exposed with coherent radiation 195 such that in the resist 1 a latent grating image 196 is formed. Then the resist 1 is developed. The result is an intermediate product as shown in FIG. 16b. The grating image 196 represents the letter field 100. Onto this intermediate product a photoresist layer 197 is applied, which due to its consistence and the greater layer thickness covers and evens out the previously applied structure as shown in FIG. 16c. With an electron beam 198 a latent image 199 is produced in the layer 197, the exposure being effected such that the layer is not exposed through to the bottom. FIG. 16d shows the result after the development. The diffraction structure 101 overlaps and replaces the diffraction structure of the letter field 100. In this way a uniform diffraction structure can be provided in a simple fashion with additional, preferably individualizing information.

Figure 17A:
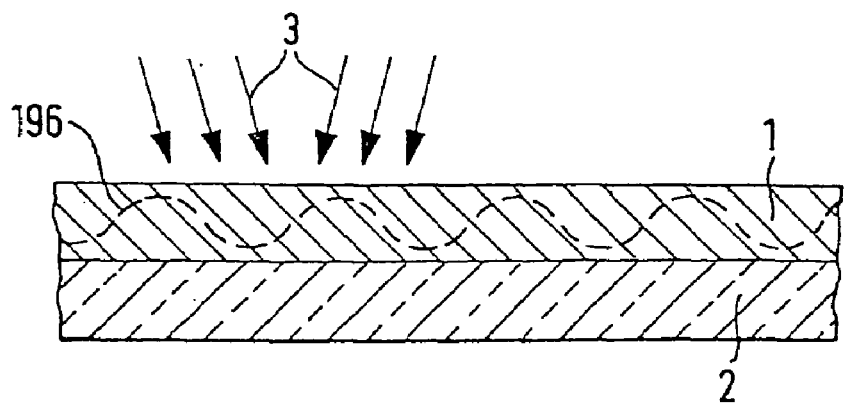
Figure 17B:
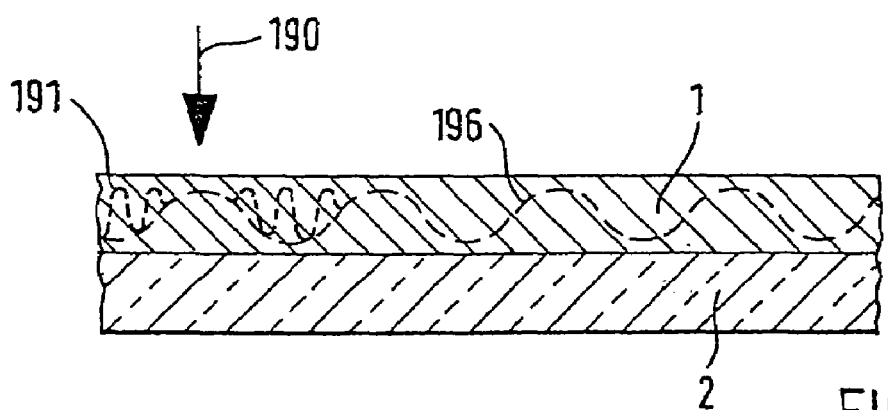
Figure 17C:
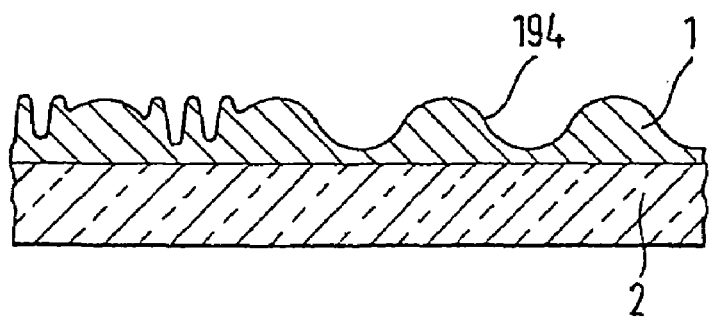

FIG. 17a to 17c show a further variant, in which a photoresist layer is exposed with two different types of radiation, in this case the images produced by the exposure processes overlap each other. In FIG. 17a a substrate 2 coated with a photoresist 1 is exposed with radiation 3 (e.g. laser light) such that in the photoresist a latent grating image 196 is formed. Then the exposure is repeated with another type of radiation 190, as shown in FIG. 17b, such as e.g. electron beam, so that the first grating image 196 is overlapped by a further grating image 191. FIG. 17c shows the result of the procedure after the development of the photoresist layer 1. The definitive grating structure 194, therefore, consists of an overlapping of the grating images 196 and 191.

Figure 18A:
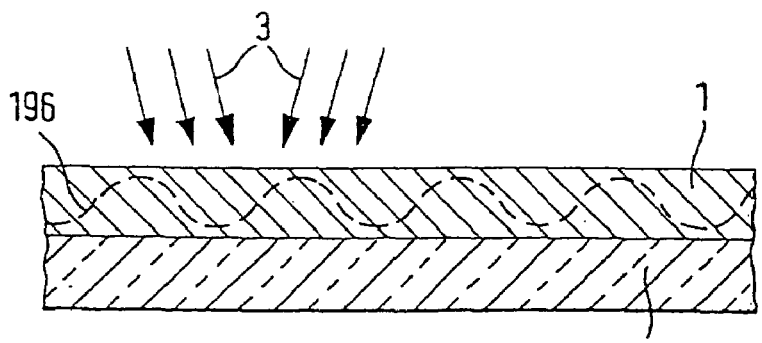
Figure 18B:
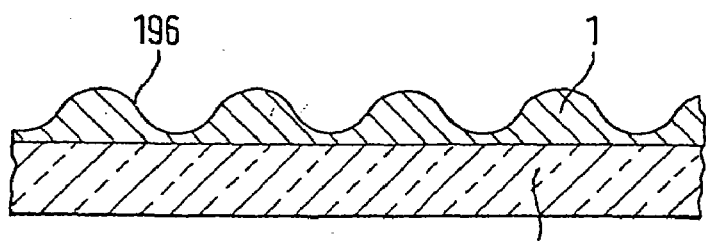
Figure 18C:
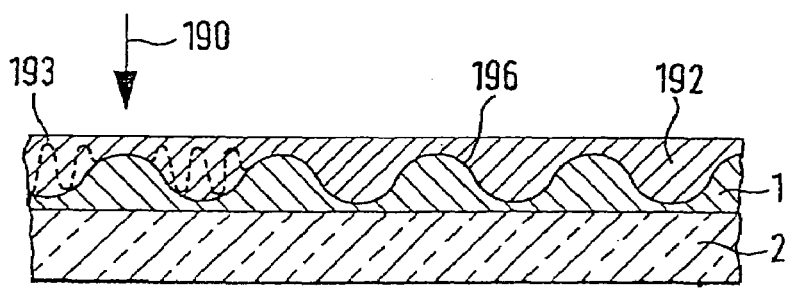
Figure 18D:
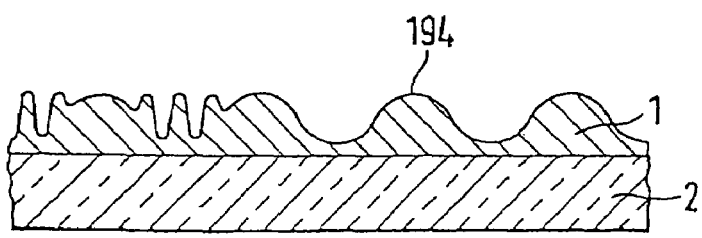

For the proceeding shown in FIG. 17 a photoresist 1 is necessary that is equally suited for the two types of radiation, which is not realizable with all types of radiation. FIG. 18a to FIG. 18d show a method, which is usable for all types of radiation. In FIG. 18a a substrate 2 coated with photoresist 1 is exposed with radiation 3, e.g. laser light, such that in the photoresist 1 a latent grating image 196 is formed. Then the photoresist 1 is developed. The result is an intermediate product as shown in FIG. 18b. Onto this intermediate product then an additional photoresist layer 192 is applied, which with respect to layer thickness and sensitivity is optimally adjusted to the exposure with the type of radiation 190, e.g. electron beam. When the layer 192 is exposed with the radiation type 190, the latent image 193 is the result, as shown in FIG. 18c. FIG. 18d shows the result after the development of the photoresist. Here, too, the definitive grating structure 194 consists of overlapping grating images 196 and 193.

It is obvious that for the method according to the invention also any other layer structures can be used. It may be expedient to dispose the reflection-preventing absorbing layer on the bottom side of the substrate 2, so that photoresist layer and absorbing layer are disposed on different surfaces of the substrate.

Furthermore, in all shown methods substrates can be used, which are already provided with a diffraction structure, such as e.g. galvanic shims, embossed plastic foils or metal foils. However, in some cases it may be sufficient, to provide this special substrates merely with a further photoresist layer and to expose this according to the shown methods.

All described method variants can be combined with each other in any fashion. The methods explained in connection with the resist master according to FIG. 4 can also be used for producing or combining other different grating images.

The relief structures or exposed substrates can be processed as resist masters as usual in optical holography. Therefore, subsequently a thin silver layer is applied by vapor deposition or chemical deposit, and a nickel mold is made in the galvanic bath. The nickel mold can be duplicated and used as an embossing tool for embossing an embossed layer. In the end the embossed layer is transferred onto the definitive substrate, e.g. a bank note, credit card or a packaging material, with or without a metallically shining reflection layer.

The invention claimed is:

1. Method for producing a resist master having at least first and second image areas, said image areas being different from each other and at least one of said image areas having a diffraction structure, the method comprising the separate steps of:
   coating a substrate with a first photoresist being adjusted to the type of the first image area to be produced;
   exposing the first photoresist with radiation in the first image area;
   developing the first photoresist;
   applying a second photoresist layer onto the substrate, said second photoresist layer being adjusted to the type of the second image area to be produced;
   exposing the second photoresist with radiation in the second image area;
   developing the second photoresist;
   wherein the steps of exposing the first and the second photoresist with radiation include exposing diffraction structures in at least one of the first and the second photoresist layer;
   wherein for both the first photoresist layer and for the second photoresist layer, either a positive resist or a negative resist is selected respectively; and
   wherein in the case of a positive resist, at first the respective image area is exposed and then under the usage of a mask the surrounding area is exposed with radiation.

2. Method according to claim 1, wherein the photoresist layers in the image areas are applied in different layer thickness.

3. Method according to claim 2, wherein the photoresist layers consist of the same material.

4. Method according to claim 1, wherein the photoresist layers are adjusted to the type of the relief profile to be produced.

5. Method according to claim 1, wherein the photoresist layers are adjusted to different types of radiation.

6. Method according to claim 1, wherein the photoresist layers are disposed one above the other or side-by-side.

7. Method according to claim 1, wherein the different image areas at least partially overlap each other.

8. Method according to claim 7, wherein the overlapping image areas are exposed in a photoresist layer.

9. Method according to claim 7, wherein the overlapping image areas are exposed in photoresist layers that lie one above the other.

10. Method according to claim 1, wherein intermediate between the first photoresist layer and the second photoresist layer a barrier layer is applied.

11. Method according to claim 10, wherein for the barrier layer a metal layer or oxide layer is selected.

12. Method according to claim 5, wherein for the radiation of a first and second type of radiation a particle radiation or electromagnetic radiation is selected.

13. Method according to claim 12, wherein for the radiation of a first or second type of radiation an electron beam or laser is selected.

14. Method according to claim 1, wherein in at least one of the image areas one true hologram is exposed.

15. Method according to claim 1, wherein in at least one of the image areas a grating image is written or exposed.

16. Method according to claim 1, wherein in at least one of the image areas a zero-order grating image is written or exposed.

17. Method according to claim 1, wherein more than two image areas are produced.

18. Method according to claim 1, wherein at least one of the photoresist layers is applied onto a glass plate, an embossed plastic foil or metal foil or a galvanic shim and is exposed there.

19. Method for producing a resist master, which has at least two different image areas, at least one of said image areas having a diffraction structure, wherein a substrate is provided with a photoresist layer, and the photoresist layer in one image area is exposed with light radiation and in the other image area with particle radiation.

20. Method according to claim 19, wherein the different image areas at least partially overlap each other.

21. Resist master with at least one photoresist layer, comprising a first image area which is exposed with light radiation, and a second image area which is exposed with particle radiation, at least one of said image areas having a diffraction structure.

22. Resist master comprising at least two photoresist layers, wherein each photoresist layer is exposed in at least one image area and the image areas in the two photoresist layers are exposed with different types of radiation, at least one of said image areas having a diffraction structure.

23. Resist master comprising at least one photoresist layer having a first image area, which has a first image area which is exposed with a grating image of zero-order, and a second image area which is exposed with a grating image of first-order.

24. Resist master comprising at least two photoresist layers, wherein each photoresist layer is exposed in at least one image area and the photoresist layers have a different layer thickness;

wherein in each photoresist layer a zero-order grating image is exposed.

25. Resist master according to claim 21, wherein the image areas at least partially overlap each other.

26. Method for producing a resist master, wherein onto an already structured carrier material an embossable lacquer layer is applied, in which a grating image is embossed.

* * * * *